(12) United States Patent
Kokubo et al.

(10) Patent No.: US 7,448,862 B2
(45) Date of Patent: *Nov. 11, 2008

(54) TRANSCRIPT APPARATUS

(75) Inventors: Mitsunori Kokubo, Numazu (JP); Kentaro Ishibashi, Numazu (JP)

(73) Assignee: Toshiba Kikai Kabushiki Kaisha, Tokyo (JP)

( * ) Notice: Subject to any disclaimer, the term of this patent is extended or adjusted under 35 U.S.C. 154(b) by 133 days.

This patent is subject to a terminal disclaimer.

(21) Appl. No.: 11/439,291

(22) Filed: May 24, 2006

(65) Prior Publication Data

US 2006/0269645 A1 Nov. 30, 2006

(30) Foreign Application Priority Data

May 25, 2005 (JP) ............................. 2005-153003

(51) Int. Cl.
*B32B 37/02* (2006.01)
(52) U.S. Cl. .................................. 425/174.4; 425/385
(58) Field of Classification Search ............. 425/174.4, 425/125, 127, 385, 808, 397; 430/397
See application file for complete search history.

(56) References Cited

U.S. PATENT DOCUMENTS

| | | | | |
|---|---|---|---|---|
| 3,828,842 A | * | 8/1974 | Tagnon | ........................ 425/808 |
| 4,316,712 A | | 2/1982 | Medendorp | |
| 4,878,826 A | | 11/1989 | Wendt | |
| 4,907,956 A | * | 3/1990 | Ezaki et al. | .............. 425/174.4 |
| 4,969,812 A | | 11/1990 | Brown | |
| 5,496,433 A | | 3/1996 | Miyashita et al. | |
| 6,364,648 B1 | * | 4/2002 | Bishop et al. | ............... 425/125 |
| 6,416,311 B1 | | 7/2002 | Springer et al. | |
| 6,699,425 B1 | | 3/2004 | Reuther et al. | |

(Continued)

FOREIGN PATENT DOCUMENTS

DE    10 2006 018 139 A1    3/2007

(Continued)

OTHER PUBLICATIONS

Precision Engineering Journal of the International Societies for Precision Engineering and Nanotechnology, 25 (2001) pp. 192-199.

(Continued)

*Primary Examiner*—Yogendra Gupta
*Assistant Examiner*—Thu Khanh T Nguyen
(74) *Attorney, Agent, or Firm*—DLA Piper US LLP

(57) ABSTRACT

A transcript apparatus having a table 11 having a placement surface on which a forming material 13 is placed; a die holder 205, disposed in opposition to the table, to fixedly hold a transcription die 41; a first gimbal member 201 having one side to hold the die holder body and the other side formed with a convex spherical surface, a second gimbal member 203 formed with a concave spherical surface facing the convex spherical surface, the gimbal mechanism guiding ultraviolet rays therein; a movable body 19, holding the second gimbal member, that is movable in a vertical direction to the placement surface; attitude adjustment and holder means to adjust and hold an attitude of the first gimbal member; and an ultraviolet ray path to guide ultraviolet rays emitted from an ultraviolet ray generator 42 onto the forming material through the transcription die.

19 Claims, 8 Drawing Sheets

U.S. PATENT DOCUMENTS

| | | | |
|---|---|---|---|
| 6,808,443 B2 * | 10/2004 | Halley | 451/287 |
| 7,070,405 B2 * | 7/2006 | Sreenivasan et al. | 425/174.4 |
| 7,140,861 B2 * | 11/2006 | Watts et al. | 425/174.4 |
| 7,150,622 B2 | 12/2006 | Choi et al. | |
| 7,204,686 B2 | 4/2007 | Chung et al. | |
| 2004/0200368 A1 | 10/2004 | Ogino et al. | |
| 2005/0089597 A1 | 4/2005 | Ito | |
| 2006/0037406 A1 | 2/2006 | Dharia | |
| 2006/0193938 A1 | 8/2006 | Iimura et al. | |
| 2006/0233906 A1 | 10/2006 | Kokubo et al. | |

FOREIGN PATENT DOCUMENTS

| | | |
|---|---|---|
| JP | 2004-034300 | 2/2004 |
| JP | 2004-288784 | 10/2004 |
| JP | 2004-358857 | 12/2004 |

OTHER PUBLICATIONS

Search Report issued in counterpart foreign Taiwanese Application No. 095114106, mailed Jan. 31, 20008.

Partial English translation of Search Report issued in counterpart foreign Taiwanese Application No. 095114106, mailed Jan. 31, 20008.

English language abstract of TW 368465, 1999.

English language abstract of TW 476700, published Feb. 21, 2002.

English language abstract of TW 458882, published Oct. 11, 2001.

English language abstract of TW 200413159, 2004.

English language abstract of JP 2004-034300, published Feb. 5, 2004.

Stephen Y. Chou et al., "Nanoimprint Lithography", J. Vac. Sci. Technol. B, vol. 14, No. 6, pp. 4129-4133 (1996).

Office Action in U.S. Appl. No. 11/415,130 mailed Feb. 4, 2008.

Office Action in U.S. Appl. No. 11/404,799 mailed Feb. 6, 2008.

German Office Action issued on Aug. 3, 2007, in related Application No. 10 2006 021 507.9.

English translation of German Office Action issued on Aug. 3, 2007, in related Application No. 10 2006 021 507.9.

English Abstract of JP Publication No. 2004-288784 published on Oct. 14, 2004.

Machine translation of JP Publication No. 2004-288784 2004.

Machine translation of JP Publication No. 2004-034300, 2004.

English Abstract of JP Publication No. 2004-358857 published on Dec. 24, 2004.

Machine translation of JP Publication No. 2004-358857, 2004.

Office Action in Korean Application No. 10-2006-34744, 2007.

English translation of Korean Office Action (KR Appl. No. 10-2006-34744), 2007.

Notice of Allowance issued in U.S. Appl. No. 11/404,799 mailed Jul. 9, 2008.

Notice of Allowance issued in U.S. Appl. No. 11/415,130 mailed Aug. 12, 2008.

* cited by examiner

TRAJECTORY OF CENTER OF GIMBAL UPPER SURFACE

PROJECTION OF UNIT NORMAL VECTOR n OF
GIMBAL UPPER SURFACE ON XY PLANE

TRANSCRIPT APPARATUS

BACKGROUND OF THE INVENTION

The present invention relates to transcript apparatuses for transcribing a finely engraved pattern formed on a surface of a die onto a surface of a forming product using lithographic technology, and more particularly, to a transcript apparatus that can minimize positional displacement (lateral displacement) between a die and a forming product.

In recent years many researches have been done in the field of a nanoimprint technology. This technology is to transcribe a pattern formed on a die to a forming product, and concretely press with a given pressure a die (template or stamper) on which an ultra-fine pattern is formed by an electron-beam printing method onto a resist film formed on a surface of a transcription substrate (see the literature: Precision Engineering Journal of the International Societies for Precision Engineering and Nanotechnology). Here the die is composed of, for example, a quartz crystal substrate and the resist film serves as a firming product.

When performing such a transcription using a lithograph technology, an attitude of the die needs to be finely adjusted to a surface of the forming product under the following condition: The surface of the forming product is brought into close and uniform contact with a transcription surface formed with a pattern of the die. By so doing, a finely engraved pattern formed on the die is precisely transcribed to the forming product.

In order to finely adjust an attitude of a die in such a way, the above literature discloses a transcript apparatus having a die holder made of flexible raw material. This transcript apparatus drives the die holder such that a die moves along a surface of a forming product so as to press a transcription surface of the die onto the surface of the forming product.

Then the transcript apparatus needs to press the die onto the surface of the forming product with low pressure possible in order to avoid damages to the forming product. Thus the die holder is structured to cope with low pressure for controlling the attitude of the die. Accordingly, after finely adjusting the attitude of the die to the surface of the forming product, the transcript apparatus needs high pressure for transcribing the pattern formed on the transcription surface of the die onto the surface of the forming product.

However, as mentioned above, since the die holder is to cope with low pressure for the attitude control of the die, the transcript apparatus faces a difficulty in applying high pressure needed for transcription. Further, since the forming product is made of various materials in accordance with the intended use, transcription pressure needs to be properly regulated when transcribing the pattern formed on the die onto the forming product.

In addition, transcript apparatuses of this kind need to maintain an alignment of contact surfaces facing between a die and a forming product in a strictly parallel with each other, and to minimize mutual positional displacement between the die and the forming product during die-pressing and die-removing processes.

A transcript apparatus disclosed in Japanese Patent Application Laid-open No. 2004-34300 is comprised of: an L-shaped frame 101 including a lower horizontal section 101A and a vertical section 101B; an X-Y stage 102 mounted on the lower horizontal section 101A; a forming product support section 103 mounted on the X-Y stage 102; a moving mechanism 104 located on the vertical section 101B of the frame 101 to be vertically movable; and a die support section 105 supported on the vertical section 101B by means of the moving mechanism 104.

The forming product support section 103 is comprised of a support member (forming product support member) 106 and a magnetic body 107 mounted on the support member 106. The magnetic body 107 allows a forming product 108 to be set thereonto. The die support section 105 is comprised of a support member 109 vertically movable by the moving mechanism 104 and a magnet 111 mounted on a lower surface of the support member 109 by means of a resilient member 110. The magnet 111 permits the die 112 to be set onto a lower surface thereof.

With such a transcript apparatus, the resilient member 110 absorbs deviations from parallel alignment between a surface of the die 112 and a surface of the forming product 108. Further magnetic attraction force generated between the magnet 111 and the magnetic body 107 avoids positional displacement between the support member 109, by which the die 112 is supported, and the support member 106, by which the forming product 108 is supported. Here the positional displacement means lateral displacement caused by relative movement in a direction (horizontal direction) perpendicular to a pressing direction.

SUMMARY OF THE INVENTION

However, the transcript apparatus has issues as follows: When the die 112 is pressed against the forming product 108 by magnetic attraction force generated between the magnet 111 and the magnetic body 107, if the die 112 is subject to excessively strong pressing force, its reaction force causes an upper area of the vertical section 101B of the frame 101 slightly warps leftward as viewed in FIG. 1. Consequently, the reaction force slightly misaligns the die 112 and the forming product 108 (that is, minute positional displacement). Such positional displacement also occurs when the frame 10 is deformed due to temperature variations.

Also, when a performing process is performed using ultraviolet rays, the transcript apparatus preferably needs to take a structure wherein a light guide path for the ultraviolet rays is perpendicular to a transcription area in order to introduce the ultraviolet rays to the transcription area. However, the transcript apparatus has an issue to realize such a configuration.

The present invention has been completed with the above issues in mind and has an object to provide a transcript apparatus which can simplify a die holding structure by adopting a gimbal mechanism instead of a die holder made of flexible raw materials and can minimize positional displacement (lateral displacement) by pressing force, temperature variations, and others, while enabling a light guide path for ultraviolet rays to be introduced in a direction perpendicular to a transcription area.

According to an aspect of the present invention, there is provided a transcript apparatus comprising a table having a placement surface on which a forming material is placed; a die holder, disposed in opposition to the table, for fixedly holding a transcription die made of an ultraviolet transmitting material, the die holder being made of an ultraviolet transmitting material; a gimbal mechanism, guiding ultraviolet rays therein, that includes a first gimbal member having one side to hold the die holder body and the other side formed with a convex spherical surface, and a second gimbal member formed with a concave spherical surface facing the convex spherical surface; a movable body, holding the second gimbal member, that is movable in a vertical direction to the placement surface; movable body drive means driving the movable body in the vertical direction; attitude adjustment and holder means for adjusting and holding an attitude of the first gimbal member; an ultraviolet ray generator; and an ultraviolet ray path for guiding ultraviolet rays emitted from the ultraviolet ray generator onto the forming material through the transcription die.

DETAILED DESCRIPTION OF THE PREFERRED EMBODIMENT

Figure 1:
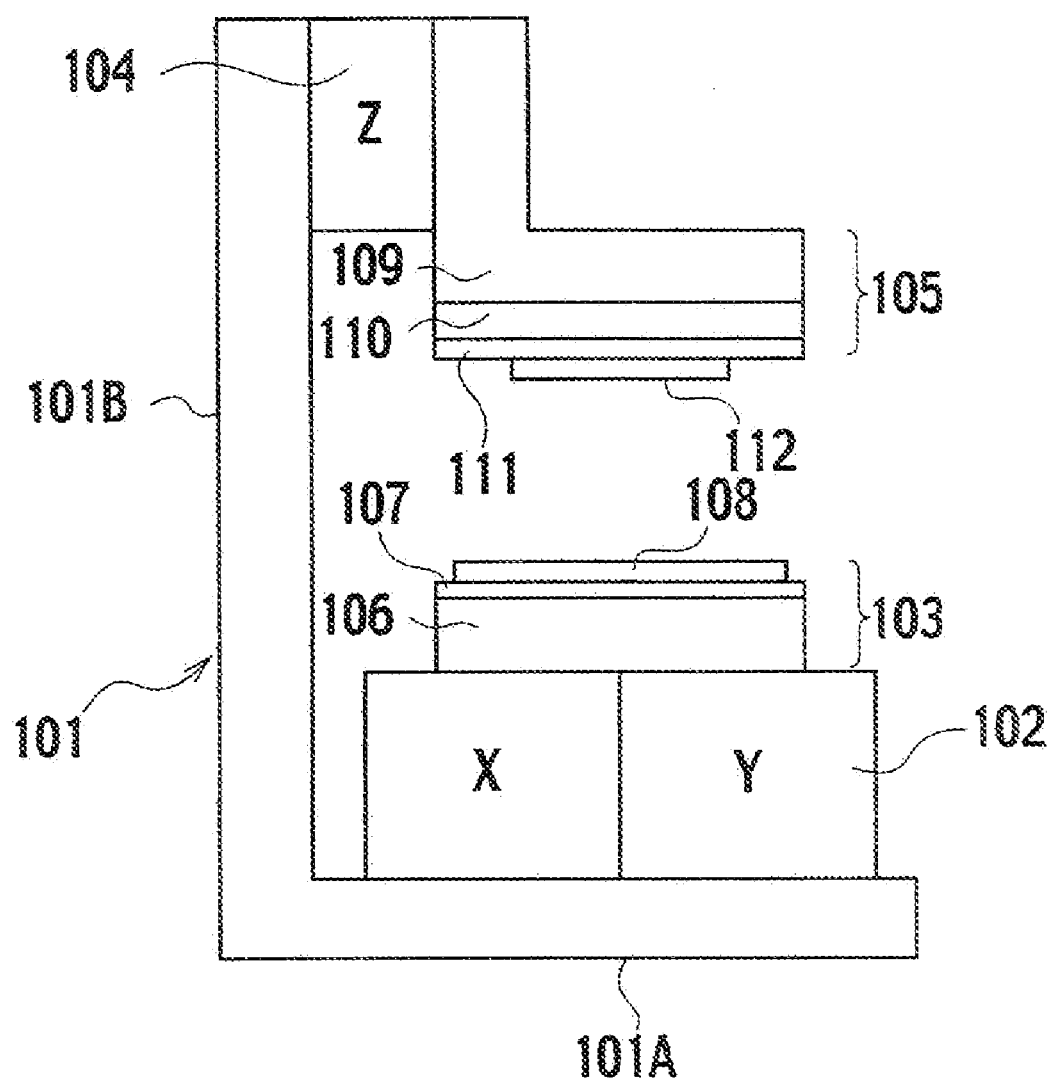
FIG. 1 is a view showing a structure of a transcript apparatus of the related art.
Figure 2:
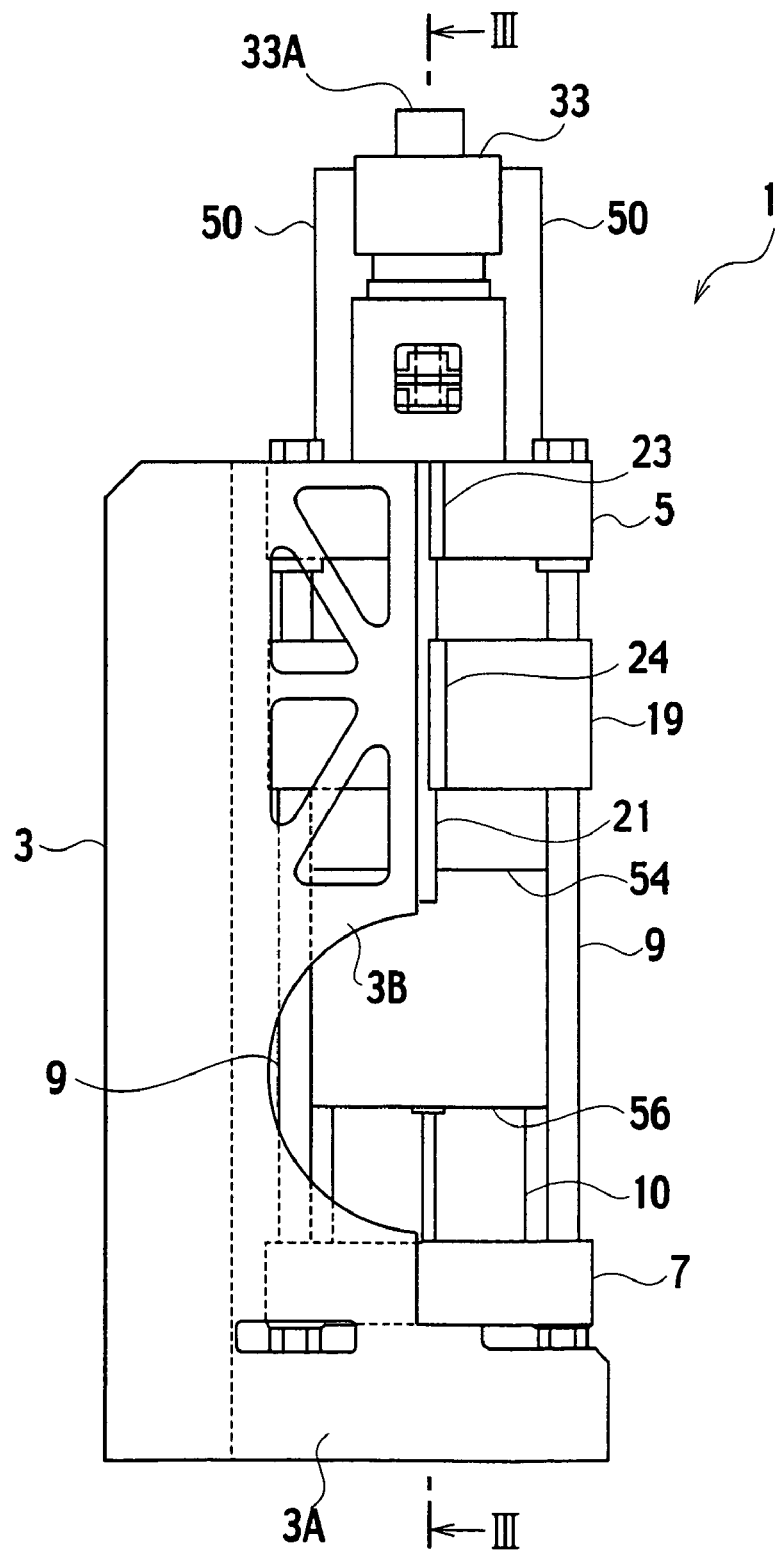
FIG. 2 is a left side view showing one embodiment of a transcript apparatus according to the present invention.
Figure 3:
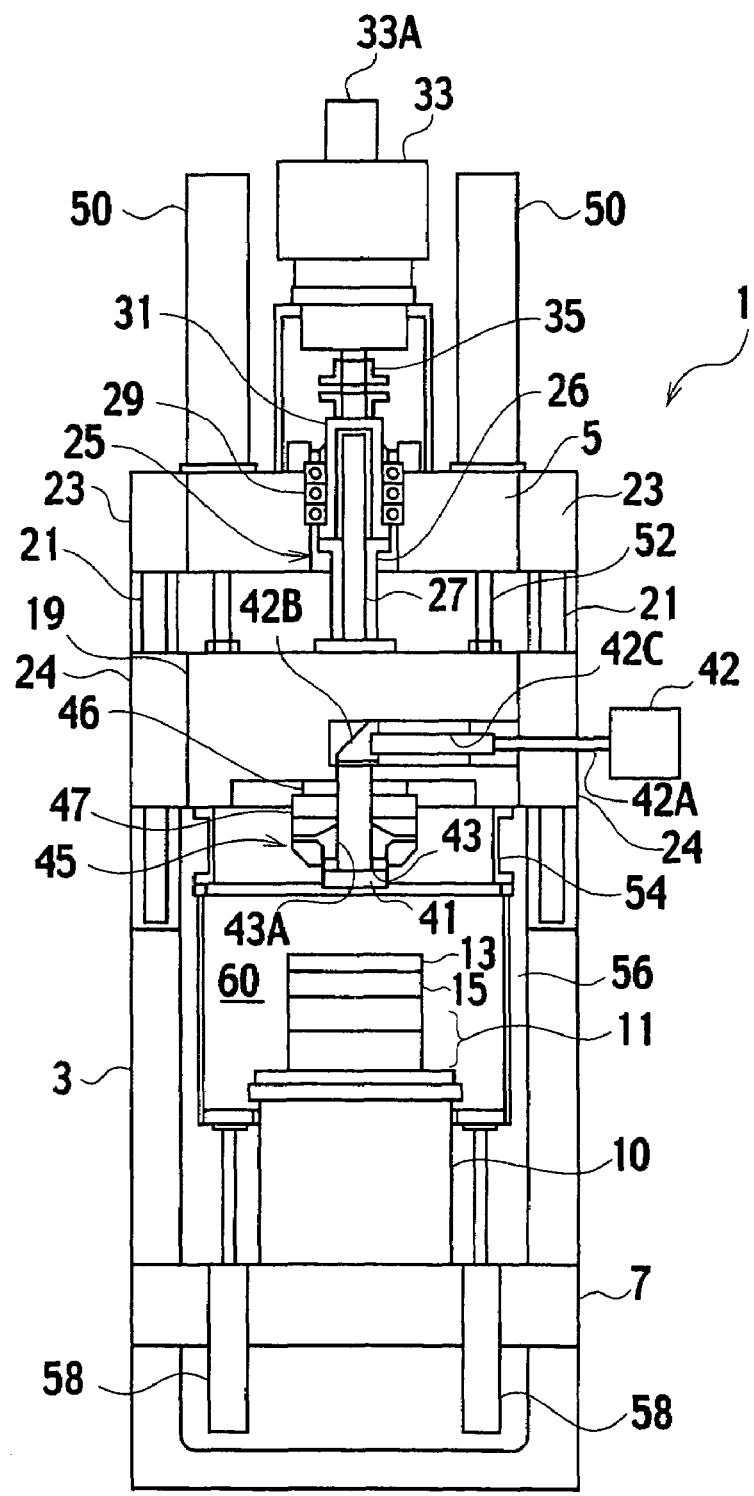
FIG. 3 is a cross sectional view taken along line III-III of FIG. 2.

As shown in FIGS. 2 and 3, a transcript apparatus 1 of one embodiment according to the present invention includes: a body frame 3 having a generally L-shaped side shape; a square-shaped lower frame (base frame) 7 integrally mounted on a lower side of a frame support section 3A by which the lower frame 7 is supported; die bars 9 standing upright from four corners of the lower frame 7 in parallel to a vertical section of the body frame 3; a square-shaped upper frame (support frame) 5 located on upper ends of the die bars 9 for supporting a drive means; and a square-shaped movable body 19 supported on the die bars 9 to be movable in a direction along the die bars 9 (vertical direction) in a space between the upper frame 5 and the lower frame 7.

The body frame 3 has an upper area formed with a pair of guide frames 3B, 3B. The guide frames 3B, 3B protrudes forward (rightward in FIG. 2) such that their end faces reach positions substantially half of left and right side faces of the upper frame 5 and the movable body 19. In addition, the guide frames 3B, 3B has distal ends provided with vertically extended linear guides (guide means) 21. The upper frame 5 and the movable frame 19 have left and right side surfaces carrying on sliders 23, 23 and sliders 24, 24, respectively. The sliders 23, 23 and the sliders 24, 24 are engaged to the linear guides 21, 21, and are movably guided in a vertical direction with high precision under, for instance, zero clearance.

In summary, the body frame 3 has one end side (a lower side) provided with the frame support section 3A by which the lower frame (base frame) 7 is supported. Thus the body frame 3 is provided with a generally L-shaped configuration from a side view. The other end side (on an upper side) of the body frame 3 has left and right sides (a vertical direction in FIG. 4) provided with the guide frames 3B, 3B. The fuide frames 3B, 3B have the linear guides 21, 21 and protrude forward. Thus the body frame 3 is provided with a structure wherein the upper end side is formed with a concave portion.

Figure 4:
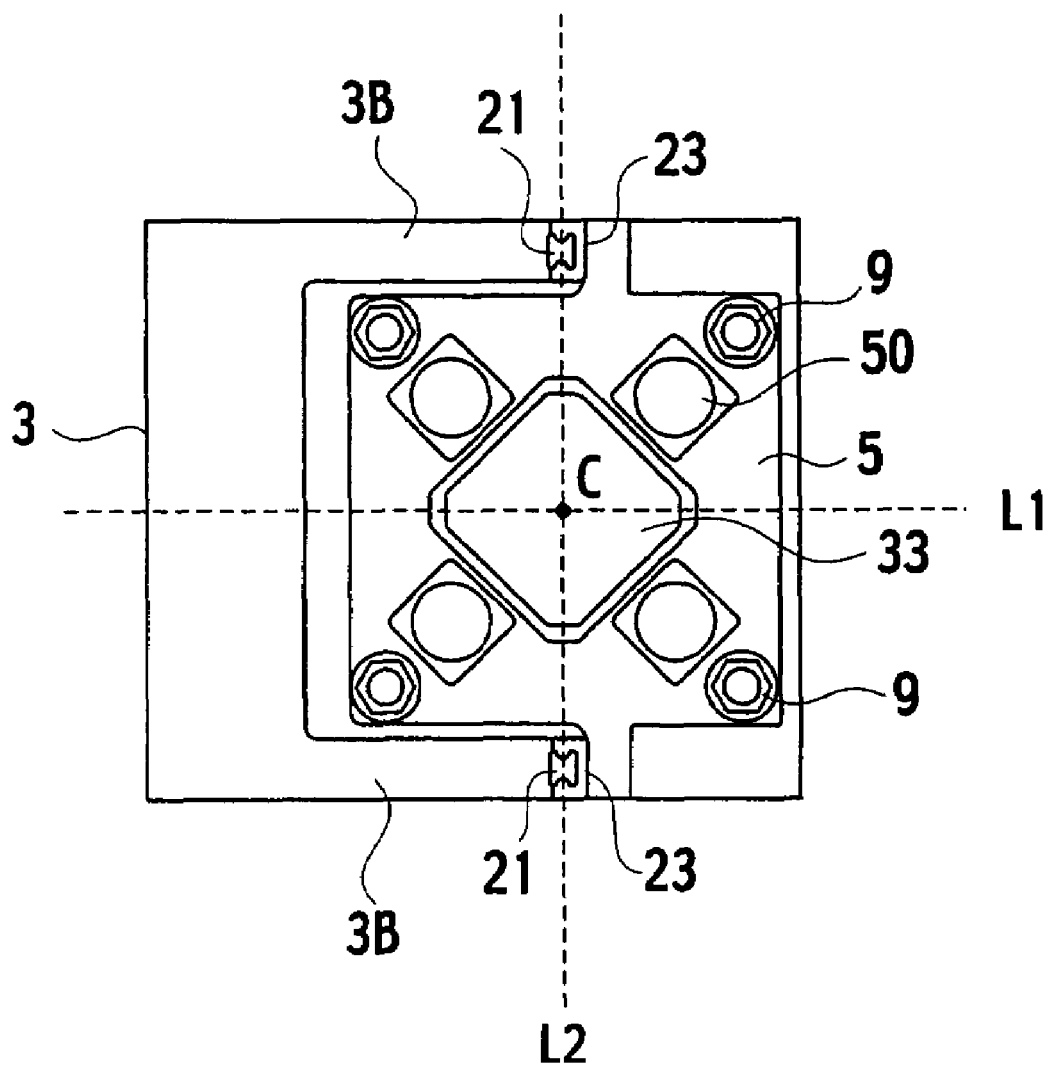
FIG. 4 is a plane view of the transcript apparatus shown in FIG. 2.

Moreover, as shown in FIG. 4, the upper frame 5 and the movable body 19 are disposed between the left and right guide frames 3B, 3B of the body frame 3. Engagement portions between the sliders 23, 23 and the sliders 24, 24 and the linear guides 21, 21 are located at positions symmetric to a center line L1 passing across the intersection C between the center line L1 extended in a back and forth direction (a lateral direction in FIG. 4) of the movable body 19 and a center line L2 extended in a horizontal direction (the vertical direction in FIG. 4). Here the sliders 23, 23 and the sliders 24, 24 are provided on the upper frame 5 and the movable body 19.

Also, while the linear guides 21, 21 of FIG. 2 are provided in common to the sliders 23, 23 and the sliders 24, 24, an alternative may be possible such that linear guides are separately provided for the sliders 23, 23 and the sliders 24, 24. However, when considered in ease of machining and machining precision on a mutually parallel alignment, the linear guides 21, 21 may be preferably provided in common to the sliders 23, 23 and the sliders 24, 24.

Although the upper frame 5 is fixedly secured to the lower frame 7 and the body frame 3 via the die bars 9, the die bars 9 themselves may be expanded or contracted due to pressing force applied by the die, temperature variation, and others. For the purpose of permitting vertical movements of the upper frame 9 while preventing positional displacement (lateral deviation) of the upper frame 5 on a plane perpendicular to the die bars 9 by the bend, extension, or contraction of the die bars 9, the linear guides 21, 21 and the sliders 23, 23 are provided. This can the prevent positional displacement (lateral deviation) of the upper frame 5 in a further reliable manner and allows the upper frame 9 to be disconnected from the body frame 3 to be merely connected and fixed to the lower frame 7 by means of the die bars 9.

Since the movable body 19 is slidably supported by the die bars 9 as mentioned above, using the linear guides 21, 21 and the sliders 23, 23 allows the movable body 19 to be precisely guided up and down (in a direction perpendicular to a plane of the table 11).

In order to avoid positional displacement (lateral displacement) between the upper frame 5 and the movable body 19 by temperature variations, the linear guides 21, 21, the sliders 23, 23, and the sliders 24, 24 may be preferably located at positions symmetric to the center line L1 passing across the intersection C between the center line L1 extended in the back and forth direction of the upper frame 5 and the movable body 19 and the center line L2 extending along the horizontal direction.

The lower frame 7 has an upper surface with a central area carrying on a stationary bed 10 that is vertically extended upward. As shown in FIG. 3, the stationary bed 10 carries on movable tables 11, including X- and Y-tables, which can be moved in X- and Y-directions (lateral and vertical directions) and can be positioned upon fine adjustments. The movable tables 11 carry on a support head 15 on which a forming product is supported. The movable tables 11 are guided by linear guides and sliders and driven by a servomotor, but the detailed description is omitted because of its well-known structure.

The forming product 13 is comprised of a thin film that a forming layer made of ultraviolet curing resin is applied on an upper surface of a substrate made of suitable material such as silicone, glass, or ceramics. The forming layer has a thickness in the order of several tens nanometers to several micrometers. If such a forming layer employs a resist made of thermoplastic resin, the support head 15 can incorporate a heating means (not shown) such as a heater to thermally soften the forming layer to provide ease of forming.

As shown in FIG. 3, the movable body 19 has a lower central area (a center of a surface opposite to the lower frame 7) carrying on a turntable 47 by means of a load cell 46. The turntable 47 can be turned about a center of the lower central area of the movable body 19 and fixedly secured at a given angular position. A die support plate 43 is mounted on the turntable 47 by means of a gimbal mechanism 45 and detachably carries a die 41. The die 41 is a transcription die made of an ultraviolet transmitting material.

The gimbal mechanism 45 takes a structure wherein a spherical surface, centered at a central area of a die surface (a lower surface in FIG. 3) of the die 41, serve as a guide surface available to freely tilt the die 41 about the center of the die surface, and the guide surface is air stuck to enable an attitude of the die 41 to be fixed in an unmoved state.

The die 41 has the die surface on which a finely engraved pattern is formed by a lithographic technology. The die 41 is made of transparent quartz glass that is easy to transmit ultraviolet rays in the present embodiment.

All of the die support plate 43, the gimbal mechanism 45, the turntable 47, and the load cell 46 have central areas through which through-bores 43A is extended. The movable body 19 has a through-bore (light guide path) 42C which guides ultraviolet rays, emitted from an ultraviolet ray generator (ultraviolet light source) 42, from the through-bores 43A to a backside of the die 41 via an optical fiber 42A and a reflection mirror 42B. The ultraviolet ray generator 42 is held to the movable body 19 in a lateral side of the movable body 19.

The light guide path serves to guide ultraviolet rays emitted from the ultraviolet ray generator 42 to the forming material (forming product) mounted on the table 11 via the die 41. The light guide path includes: a first light guide passage to introduce the ultraviolet rays emitted from the ultraviolet ray generator 42 in a horizontal direction; a reflection mirror 42B deflecting the ultraviolet rays passing through the first light guide passage in a direction of a central axis of the gimbal mechanism 45 (that is, vertical direction); and a second light guide passage formed of a through-bore 43A formed in first and second gimbal members 201, 203 so as to guide the ultraviolet rays reflected by the reflection mirror 42B toward a die holder body 205. Here, an area closer to the reflection mirror 42B of the first light guide passage is formed in the movable body 19 and an area closer to the ultraviolet ray generator 42 of the first light guide passage is formed of an optical fiber 42A. Moreover, the reflection mirror 42B is disposed in the first light guide passage at one end thereof (at an upper side of the first light guide passage: on a side in opposition to the ultraviolet ray generator 42).

The upper frame 5 as the support plate carries on a servomotor 33 as an example of a drive means to move the movable body 19. The servomotor 33 has an output shaft 35 coupled to a hollow shaft 31. The hollow shaft 31 is mounted on the upper frame 5 via a bearing 29 only for rotatable movement. The hollow shaft 31 has a lower end to which a ball screw nut 26 forming a ball screw mechanism 25 is fixedly mounted. The ball screw nut 26 engages a ball screw shaft 27 that is fixedly mounted onto the movable body 19 in a central axis of the movable table 19 for moving the movable body 19 up and down with a given speed and torque. Also, a rotation position of the servomotor 33 is detected by a rotary encoder 33A.

As shown in FIG. 3, a plurality of balance cylinders 50 as an example of a balance taking means are amounted on the upper frame 5 at positions symmetric to the center of the movable body 19. The balance cylinders 50 have piston rods 52 connected to the movable body 19, respectively, to cancel the load (gravitational load) of the movable body 19.

Mounted on the lower surface of the movable body 19 is a ring-shaped upper cover 54 by which the die support plate 43 is surrounded. On the contrary, mounted on the lower frame 7 is a ring-shaped lower cover 56 so as to surround the movable table 11. The ring shaped lower cover 5 has a lower end which engages a periphery of the stationary bed 10 for moving capability and an upper end which is formed to bring into abutting engagement with a lower end of the upper cover 54. The lower cover 56 is moved up and down by a plurality of cylinders 58 as an example of a vertical motion actuator. The cylinders 58 are mounted to the lower frame 7. The upper cover 54 and the lower cover 56 define an openable and closable forming chamber 60 around the die support plate 43 and the movable table 11.

Next, we explain operations of the transcript apparatus.

The cylinders 58 as the vertical motion actuator are actuated to move the lower cover 56 downward, thereby opening the forming chamber 60. The die 41 is mounted onto the die support plate 43 and the turntable 7 finely adjusts a mount (rotation) angle (die orientation) of the die 41 in a horizontal direction about the center of the die 41. In addition, the mount angle adjustment for the die 41 may be automatically conducted with each forming product 13 set on the support head 15 by a well-known positioning means with the use of a marking.

After the die 41 is set in such a manner, the forming product 13, whose upper surface is coated with the forming layer made of ultraviolet curing resin, is set to the support head 15.

Subsequently, the cylinders 58 are actuated to lift the lower cover 56, thereby closing the forming chamber 60. The servomotor 33 is then actuated with torque set to a relatively small value to move the movable body 19 downward. This causes the die 41 to come closer to the forming product 13 such that the die 41 is pressed against an upper surface of the forming product 13 by relatively small pressing force.

When this takes place, the linear guides 21, 21 disposed both sides in the upper area of the body frame 3 and the sliders 24, 24 held in engagement with the linear guides 21, 21 enable the movable body 19 to be moved downward with minimal positional displacement (lateral displacement) of the movable body 19 in a direction intersecting a movable direction of the movable body 19. Thus, the die 14 can be brought into pressing engagement with the forming product 13 in a direction toward a given position. At this time, the balance cylinders 50 cancel the load (gravitational load) of the movable body 19, and consequently, the servomotor 33 enables the movable body 19 to move downward with a precisely controlled speed and torque.

When the die 41 is pressed against the forming product 13, even if abutting surfaces (contact surfaces) of them are out of parallel alignment, the die 41 is tiltability supported with the gimbal mechanism 45. Therefore a whole surface of the die 14 can be pressed against the upper surface of the forming product 13 with uniform surface pressure. Then, since the gimbal mechanism 45 allows the die 41 to be tilted about the center of the central area of the die surface along the spherical surface centered at the central area of the die surface (lower surface in FIG. 3) of the die 41, the positional displacement of the die 14 in a lateral direction (horizontal direction) is not occurred.

The pressing force is detected by the load cell 46, and the detected signal is fed back to the servomotor 33 to keep the pressing force at a given value. Even at this time, since the balance cylinders 50 can cancel the load of the movable body 19, the servomotor 33 is enabled to precisely perform torque control.

When the pressing step using relatively small pressing force is completed in such a way, the air bearing of the gimbal mechanism 45 is reduced to be negative pressure to fixedly secure the attitude of the die 41 in an unmoved state and subsequently the servomotor 33 increases torque. Such an increase of torque causes the die 41 to be strongly pressed against the forming layer made of ultraviolet curing resin coated over the upper surface of the forming product 13. Consequently, the finely engraved pattern formed over the surface of the die 41 is transcribed onto the forming layer of the forming product 13.

Then the strong pressing force of the die 41 makes the die bars 9 slightly extended and the upper frame 5 displaced upward. However, since the linear guides 21, 21 and the sliders 23, 23 absorb such displacement of the upper frame 5, an upper portion of the body frame 3 to warp leftward as viewed in FIG. 2. This minimizes the positional displacement (lateral displacement) of the die 41 in a direction perpendicular to the moving direction of the die 41 by the pressing force of the die 41.

Further, even if the plural die bars 9 stretch in different with each other, the structure of the upper frame 5 supported by the linear guides 21, 21 and the sliders 23, 23 enables the positional displacement (lateral displacement) of the upper frame 5 to be minimized. Consequently, the positional displacement (lateral displacement) of the die 41 can be reduced to a minimal extent.

Moreover, since there exists an extremely slight difference in the extension of the die bars 9 if the pressing force of the die 41 is relatively small, the guide means for guiding the upper frame 5, including the linear guides 21, 21 and the sliders 23, 23, may be omitted.

After the transcribing step is completed, ultraviolet rays emitted from the ultraviolet light source 42 to a backside of the die 41 through the light guide path, which is composed of the optical fiber 42A and the reflection mirror 42B, for a given time interval. Since the die 41 is made of transparent quartz glass, ultraviolet rays radiated to the backside of the die 41 pass through the die 41 and are then radiated to the forming layer, which is made of ultraviolet curing resin and coated over the upper surface of the forming product 13. Consequently, the forming layer is hardened.

Figure 5:
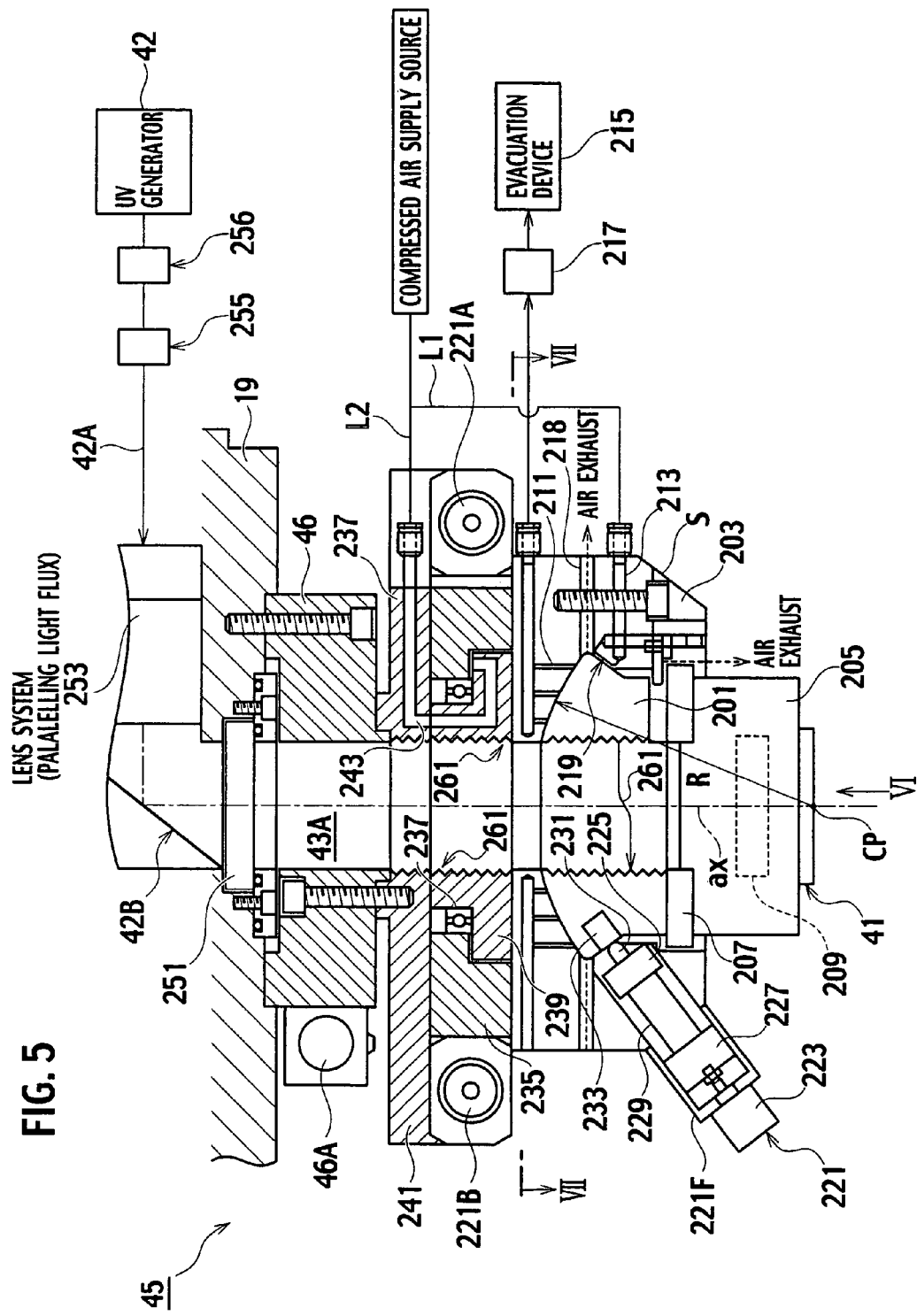
FIG. 5 is a longitudinal cross-sectional view in a vertical direction of a gimbal mechanism according to the present invention.
Figure 6:
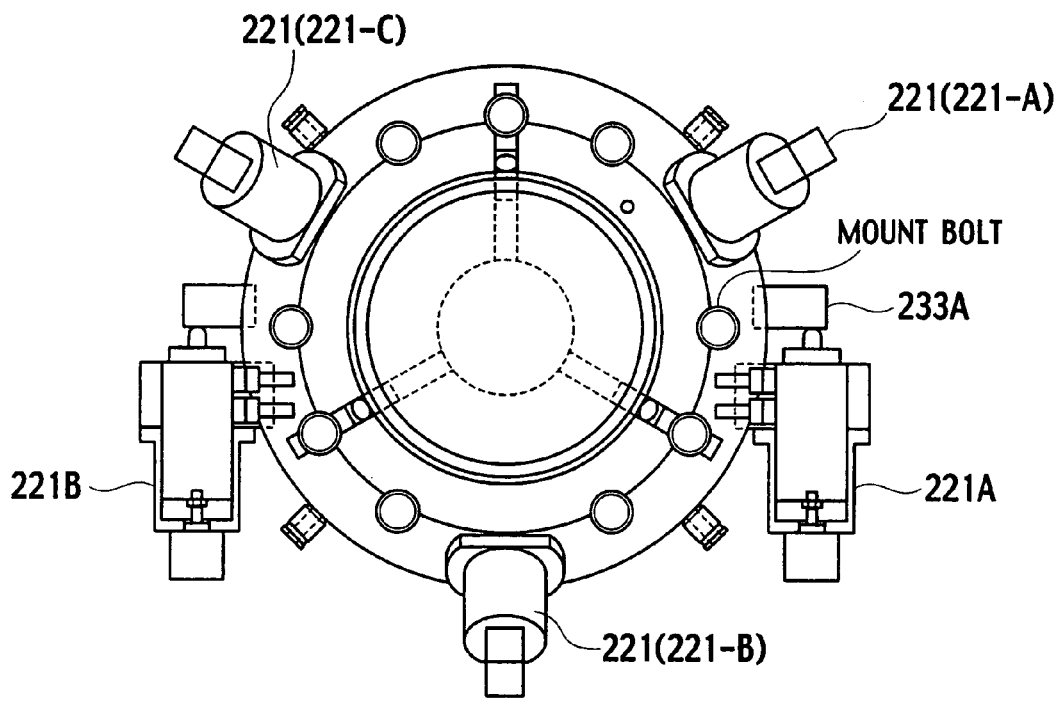
FIG. 6 is a cross sectional view along line VI of FIG. 5.
Figure 7:
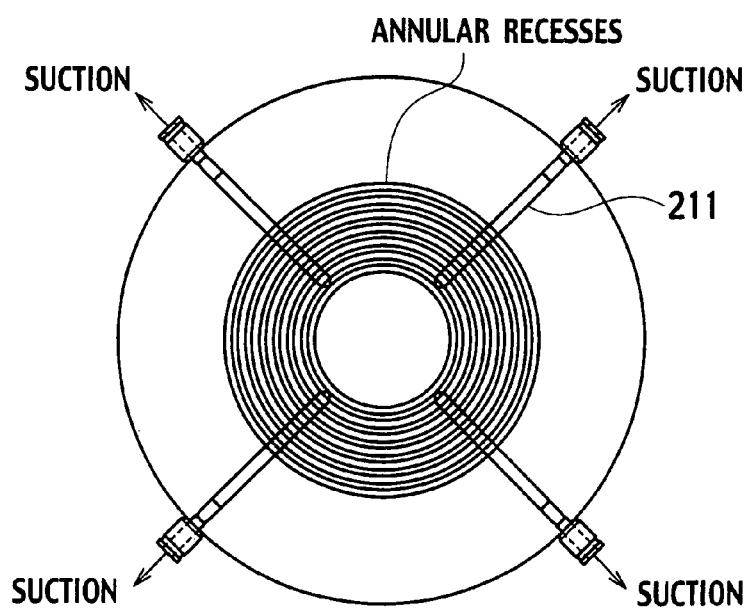
FIG. 7 is a cross sectional view along line VII-VII of FIG. 5.

After the forming layer is hardened in such a way, the servomotor 33 is driven to lift the movable body 19 to remove the die 41 away from the forming product 13 while keeping the die 41 in a fixed attitude. Subsequently, the cylinders 58 are actuated to move the lower cover 56 downward for opening the forming chamber 60, and after the forming product 13 is taken out, the transcription operation is completed FIGS. 5 to 7 shows details of the gimbal mechanism 45: FIG. 5 is a longitudinal cross-sectional view in a vertical direction; FIG. 6 a cross sectional view along the line VI of FIG. 5; and FIG. 7 a cross sectional view along the line VII-VII of FIG. 5.

As shown in FIG. 5, the gimbal mechanism 45 includes a lower gimbal member 201 formed with a convex spherical surface having a central area formed with a through-bore, and an upper gimbal member 203 formed with a concave spherical surface having a central area formed with a through-bore. Here, the upper gimbal member 203 is held in opposing contact with the lower gimbal member 201. The lower gimbal member 201 has a lower surface to which the die holder body 205 is fixedly secured via heat insulation material 207. The die 41 is mounted on a lower surface of the die holder body 205. The die holder body 205 internally incorporates a heater 209. The die holder body 205 may also internally incorporate a cooler (not shown) as well as the heater 209.

The upper gimbal member 203 is formed with suction conduits 211 that are open to a contact surface between the convex spherical surface and the concave spherical surface. The suction conduits 211 are connected to an evacuation device (negative pressure generator) 215 via a vacuum level regulator (negative pressure regulation means) 217. FIG. 7 shows details of the suction conduits 211. The upper gimbal member 203 is formed with levitation conduits 213. The levitation conduits 213 are supplied with compressed air from a compressed air supply source via a line L1. This compressed air is injected to a slant surface (levitation surface) 219 in an expanded area formed adjacent to the convex spherical surface of the lower gimbal member 201.

In particular, the slant surface 219 includes a sloped surface (or a tapered surface whose upper area has a large diameter in FIG. 5) inclined such that an upper area shown in FIG. 5 departs to a central axis "ax" of the lower gimbal member 201. The levitation conduits 213 have air ejection ports that are open to a slant surface or a tapered surface formed on the upper gimbal member 203 in opposition to the slant surface 219.

Also, the levitation conduits 213 are formed with adjustment liners 218, respectively, for adjusting a distance between opposite surfaces of the slant surface 219 and the lower gimbal member 201.

Further, three piezo hummers 221 (221-A, 221-B, 221-C) are disposed between the lower gimbal member 201 and the upper gimbal member 203. The piezo hummers 221 (221-A, 221-B, 221-C) have frames 221F (221F-A, 221F-B, 221F-C), respectively. The frames 221F (221F-A, 221F-B, 221F-C) are mounted to a lower inclined surface S of the upper gimbal member 203 at three equidistantly spaced positions. Moreover, the piezo hummers 221 (221-A, 221-B, 221-C) include air cylinders 223 (223-A, 223-B, 223-C) having high inertia bodies 227 (227-A, 227-B, 227-C) and low inertia bodies 225 (225-A, 225-B, 225-C) whose distal ends carry hummers 231 (231-A, 231-B, 231-C), respectively. Furthermore, both the inertia bodies 225 (225-A, 225-B, 225-C) and 227 (227-A, 227-B, 227-C) are connected by means of piezo (piezoelectric) elements 229 (229-A, 229-B, 229-C), respectively. Accordingly, applying given pulsed voltages to the respective piezo elements 229 (229-A, 229-B, 229-C) allows the hummers 231 (231-A, 231-B, 231-C) to instantaneously strike implant blocks 233 (233-A, 233-B, 233-C), due to a difference in inertia between both the inertia bodies 225 (225-A, 225-B, 225-C), 227 (227-A, 227-B, 227-C). Here the implant blocks are made of hard material and located in the inclines surface S of the lower gimbal member 201, respectively. Thus, as the slant surface 219 of the lower gimbal member 201 is deviated in the axial direction by the hummers 231 (231-A, 231-B, 231-C), the piezo elements 229 (229-A, 229-B, 229-C) and both the inertia bodies 225 (225-A, 225-B, 225-C), 227 (227-A, 227-B, 227-C) are deviated by the air cylinders 223 (223-A, 223-B, 223-C) according to the deviation of the slant surface 219. Due to such a structure, even if the piezo hummers 221 (221-A, 221-B, 221-C) is composed of piezo elements with a relatively small number of stack layers, the piezo hummers 221 can move with a large stroke.

The upper gimbal member 203 has an upper surface to which a rotary member 235 is fixedly secured. An inner stationary member 239 is disposed in an inner peripheral area of the rotary member 235 by means of a rotary bearing 237. Moreover, the inner stationary member 239 has an upper surface to which a plate 241 is fixedly mounted. The plate 241 and the inner stationary member 239 are formed with a conduit 243 to which compressed air is introduced via a line L2. This compressed air serves to levitate the rotary member 235 with static pressure.

As shown in FIG. 6, the rotary member 235 is rendered rotatable clockwise or counterclockwise with a pair of piezo hummers 221A, 221B. The piezo hummers 221A, 221B have frames fixedly secured to the plate 241.

Further, piezo actuators, each of which is composed of stacked piezo elements, may be employed instead of the piezo hummers 221 (221-A, 221-B, 221-C), 221A and 221B. With such a structure, in contrast to the piezo hummers, distal end positions of the piezo actuators can be electrically stored, thereby making it possible to recreate an attitude of the gimbal mechanism. That is, in a case where the piezo actuators are placed in relevant positions instead of the piezo hummers 221 (221-A, 221-B, 221-C), controlling electric command signals applied to the piezo actuators allows the piezo actuators to fixedly hold the attitude of the lower gimbal member 201. Further, storing values of the electric command signals in a memory enables the attitude of the lower gimbal member 201 to be recreated at any time upon reading out the stored values.

Also, when using the piezo actuators, the lower gimbal member 201 can be fixedly retained with a given attitude as well as can be a free state at a given position in close proximity to the table.

As shown in FIG. 5, the load cell 46 having a signal extracting terminal 46A is placed on the upper surface of the plate 241.

The ultraviolet rays emitted from the ultraviolet ray generator 42 are guided to a lens system 253 inside the movable body 19 through an ultraviolet ray intensity regulator 256, an ultraviolet ray irradiation time regulator 255 and the optical fiber 42A. The lens system 253 uniforms a distribution of the ultraviolet rays, and the uniformed ultraviolet rays is incident on the reflection mirror 42B. The ultraviolet rays, reflected at the reflection mirror 42B, travels in a downward direction of the central axis "ax" through a shielding glass member 251 and the through-bore 43A formed in the gimbal mechanism 45. Here the through-bore 43A is concentrically formed with the central axis "ax". When using ultraviolet ray curing resin as forming material, the die holder body 205 and the die 41 are made of ultraviolet transmitting materials such as quartz. In such a case, heater 209 is not required.

An inner peripheral surface of the through-bore 43A of the lower gimbal member 201 is formed with a threaded portion 261 as an ultraviolet reflection suppressing means. The ultraviolet rays passing from an upper area of the through-bore 43A are not completely parallel with each other. In other words, the ultraviolet rays spread to some extent. The threaded portion 261 serves to prevent the distribution of the ultraviolet rays passing through the die 41 from becoming inhomogeneous when the ultraviolet rays are reflected on the inner peripheral surface of the through-bore 43A of the lower gimbal member 201. Thus a threaded surface of the threaded portion 261 avoids the ultraviolet rays from being reflected downward. In this case, the threaded surface of the threaded portion 261 is preferably coated with an ultraviolet absorbing material. Further, instead of using the threaded portion 261, another ultraviolet reflection suppression means may be used with a structure that the inner peripheral surface of the through-bore 43A is coated with an ultraviolet absorbing material.

Although the through-bore 43A, the lens system 253, and the ultraviolet generator 42 are utilized when the forming material is made of an ultraviolet ray curing material, in other cases they may be dispensed.

The piezo hummers 221 (221-A, 221-B, 221-C) and the piezo hummers 221A, 221B may be employed in options. For example, if the gimbal mechanism 45 does not need to be turned or rotated, the rotary member 235, the inner stationary member 239, and the piezo hummers 221A, 221B may be omitted. Additionally, if the attitude of the lower gimbal member 201 does not need to be adjusted, the piezo hummers 221 (221-A, 221-B, 221-C) may be omitted.

We now explain a case where the piezo hummers 221 (221-A, 221-B, 221-C), the lens system 253, the inner stationary member 239, and the piezo hummers 221A, 221B do not mounted on the gimbal mechanism 45. This is a typical case where a forming product, such as CD and DVD, has a center point aligned with the central axis ax of the gimbal mechanism 45 and a finely engraved pattern with a rotation symmetry to the center point is formed on the forming product.

First, the movable table 11 is positioned with respect to the X- and Y-directions so as to align a center of a substrate placed on the movable table 11 to the central axis "ax" of the gimbal mechanism 45. Next, the movable body 19 is moved downward under a state where the lower gimbal member 201 is stick to the upper gimbal member 203 with the maximum suction force of the gimbal mechanism 45. When the die 41 is moved downward to a given position immediately before being brought into contact with the resin on the substrate, the downward speed is reduced and the suction force in evacuation is decreased. By so doing, the lower gimbal member 201 becomes free state and is gradually subject to forming pressure. That is, since in this process the die holder body 205 fixedly secured to the lower gimbal member 201 and the die 41 are downwardly pressed against resin on the substrate, finally the attitude of the die 41 can become parallel to the substrate. In this case, since the centers of the convex and concave spherical surfaces of the gimbal mechanism 45 are aligned with the lower bottom surface of the die 41 on the central axis "ax", positional displacement does not occur in the horizontal direction in this process (pressing and forming processes).

When decreasing the suction force in evacuation to render the lower gimbal member 201 free, a small amount of air may be preferably emitted from the air ejection port (not shown) opening to the concave spherical surface of the upper gimbal member 203 to the lower gimbal member 201. This minimizes frictional resistance between the upper gimbal member 203 and the lower gimbal member 201, thereby enabling the lower gimbal member 201 to more smoothly move. Consequently, a transcription surface of the die 41 can be easily paralleled to the substrate, thereby correctly pressing resin against the substrate.

Further, the suction force in evacuation is adjusted by individually using a plurality of suction conduits 211, shown in FIG. 7, or using these conduits in a grouped form with suitably selected plural sets. This adjustment is performed by selectively sucking proper number of the annular recesses formed on the convex spherical surface of the upper gimbal member 203. For instance, in a case where the suction is performed under a low vacuum level condition, the suction force acts on the annular recesses at odd numbers or on a small number of annular recesses. In a case where the suction is performed under a high vacuum level condition, the suction force acts on a large number of annular recesses or on all the annular recesses. With such a structure in which the number of annular recesses to be subjected to the suction force is selected, the suction force in evacuation can be adjusted. In other words, this is a structure in which the plurality of suction conduits 211 are individually communicated with the evacuation device 215 by means of valves or the suction conduits 211 are collectively communicated with the evacuation device 251 for each group by means of the valves. It is needless to say that providing further subdivided groups enables the vacuum level to be more finely adjusted.

While a signal of the rotary encoder 33A coupled to the servomotor 33 is utilized for detecting a position of the die 41 immediately before the die 1 is brought into contact with resin on the substrate, an alternative may be possible such that, for instance, the table 11 or the die holder body 205 carries on an electrical switching for the detection.

Meanwhile, the three piezo hummers 221 (221-A, 221-B, 221-C) need to be mounted on the gimbal mechanism 45 in the following case: when the gimbal mechanism 45 comes down under the same suction state as that mentioned above and the die 41 is pressed against and brought into contact with the substrate before resin is supplied onto the substrate, the die 41 is not completely paralleled to the substrate. In this case, appropriate number of voltage pulses is applied to the piezo hummers 221 (221-A, 221-B, 221-C) for the purpose of correcting the unparalleled alignment with weak suction force. When such a fine adjustment makes the alignment parallel, the gimbal mechanism is returned to the suction state and the forming operation is started. Moreover, when the die 41 is departed from the resin after the forming product has been completed, lifting the piezo hummers 221 upward while oscillated with a high frequency makes it possible to smoothly perform a separating motion. This high frequency is realized such that the hummer can be operated one or more times within a short period. Then the amplitude of the oscillation is extremely smaller than that of an ultrasound vibration, and thus the resin formed during departing step is not damaged.

Further, the reason why the pair of piezo hummers 221A, 221B need to be mounted on the gimbal mechanism 45 to turn or rotate the gimbal mechanism 45 in the following case: the central point of the forming product is aligned to the central axis "ax", and even if the central point is aligned with the central axis "ax", the substrate is subjected to an influence in a rotary position (an angular position). In this case, preliminarily measuring the rotary position allows voltage pulses corresponding to the measured value to be applied to the piezo hummers 221A, 221B, thereby enabling the gimbal mechanism 45 to be stick under a turned state. Also, in order to measure the rotary position and the degree of the parallel alignment, a marking may be located on a lower surface or the like of the upper surface of the movable table 11, the lower surface of the substrate, or the die holder body 205, and this marking is possible to be physically (for instance, optically or electrically) detected.

With the movable body 19 guided by the linear guides 21 for upward or downward movements, even if the lower surface (subscripting surface) of the die 41 are slightly inclined to the upper surface (subscript surface) of the forming product placed on the movable table 11, the gimbal mechanism 45 allows the die 41 to easily slant by following the upper surface of the forming product 13. Thus, the lower surface of the die 41 and the upper surface of the forming product 13 are brought into a parallel alignment for subscription step.

Figure 8A:
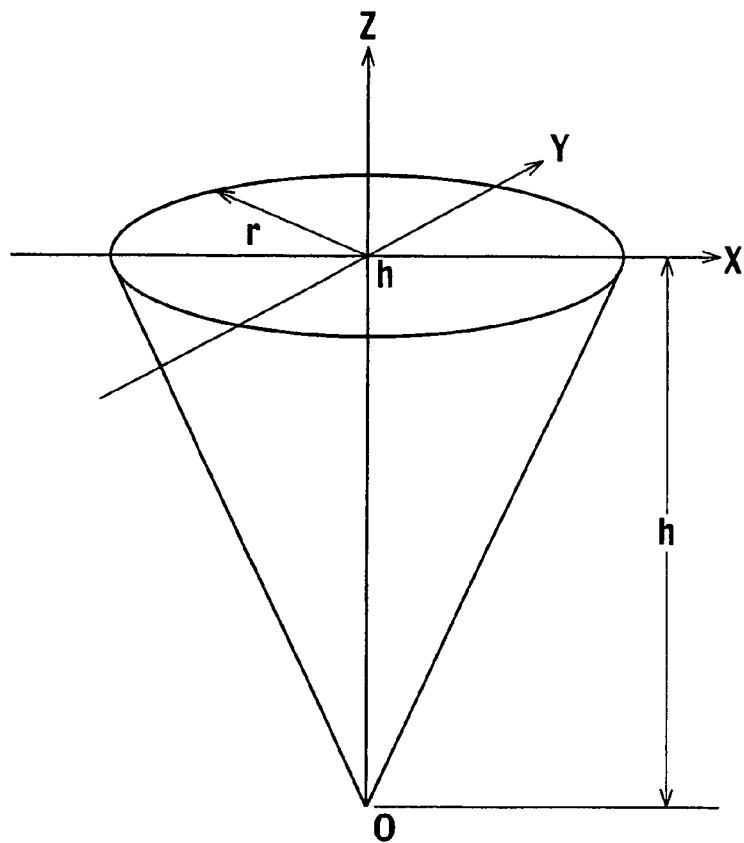
FIGS. 8A and 8B are views explaining the gimbal mechanism with a piezo actuator.
Figure 8B:
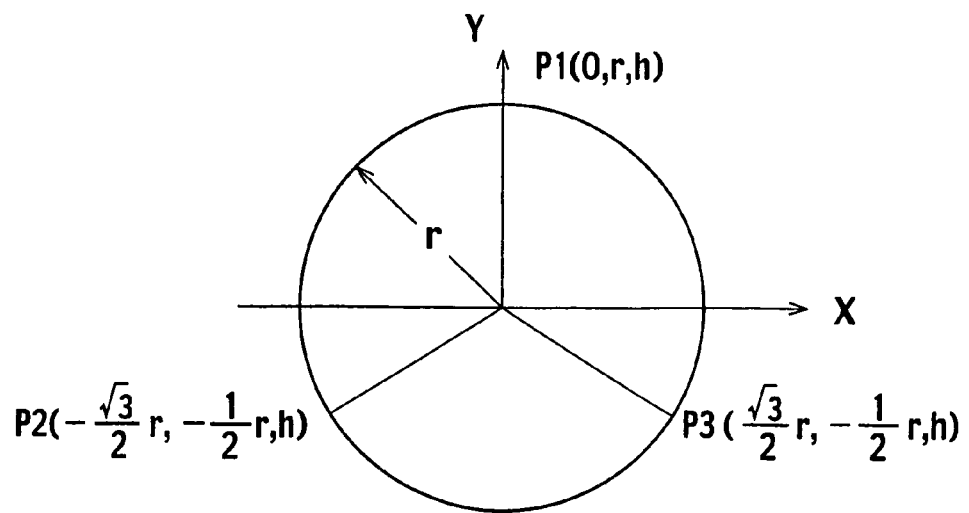

Next, we explain a method of controlling an attitude of the gimbal mechanism 45 using piezo actuators. FIGS. 8A, 8B show one embodiment in which piezo actuators (221-A, 221-B, 221-C) are mounted on the gimbal mechanism 45. Here, the three piezo actuators (221-A, 221-B, 221-C) are mounted such that they are equidistantly positioned with 120 degrees of angle and movable directions of the piezo actuators (221-A, 221-B, 221-C), and are perpendicular to a side face of the gimbal mechanism 45. As shown in FIG. 8(b), "P1", "P2", and "P3" denote mount positions of these piezo actuators (221-A, 221-B, 221-C), respectively. When each piezo actuator remains in a balanced state with no displacement, the die 41 is regarded to remain in a horizontal state. Further, as shown in FIG. 8A, the rotation center O (a center point CP at the lower surface of the die 41 in FIG. 5) of the gimbal mechanism 45 is supposed as the origin of an X-Y-Z coordinate system. As shown in FIG. 8B, the coordinate value of a contact point between the piezo actuators (221-A, 221-B, 221-C) mounted at respective points P1, P2, P3 under the balanced state and the side face of the gimbal mechanism 45 is expressed as $$P1(0, r, h), P2\left(-\frac{\sqrt{3}}{2}r, -\frac{1}{2}r, h\right), P3\left(\frac{\sqrt{3}}{2}r, -\frac{1}{2}r, h\right).$$

Here "r" represents a pitch circle radius of a circle connecting the points P1, P2, P3 and "h" represents a height from the lower surface of the die 41 to a horizontal surface spanned by the points P1, P2, P3.

In order to finely adjust the inclination of the lower surface of the die 41 by changing the attitude of the gimbal mechanism 45, applying voltages to the piezo actuators (221-A, 221-B, 221-C) under a geometric constraint condition described below allows the die 41 to be moved in a required extent.

Figure 9A:
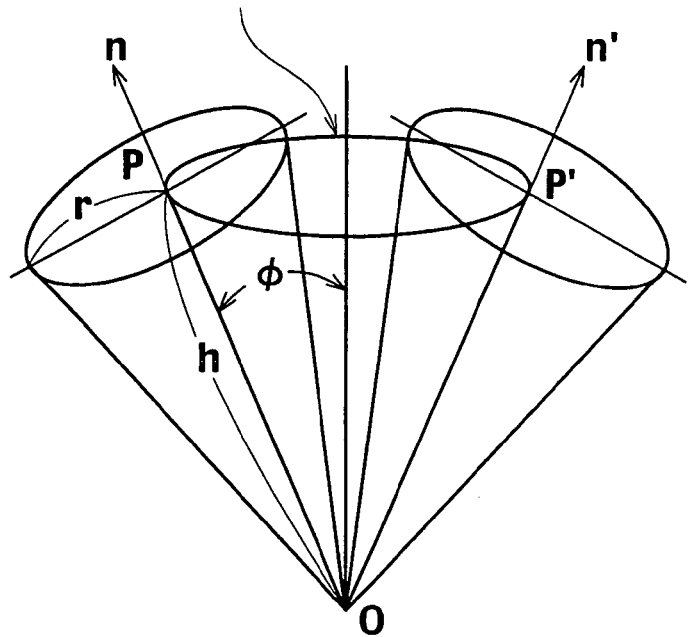
FIGS. 9A and 9B are views explaining an attitude control by the gimbal mechanism.

As understood from FIG. 9A, the geometrical constraint condition $\rho = \sin \Phi$ is satisfied where "$\Phi$" represents an inclination angle to the vertical axis (Z-axis) of the unit normal vector "n" ($|n|=1$) of the lower surface of the die 41 and "$\rho$" represents the length of the projected vector of the unit normal vector on an X-Y plane.

Figure 9B:
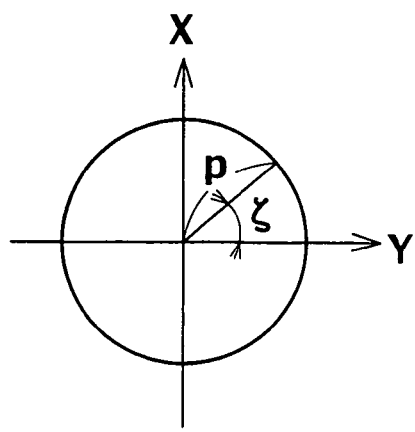

Here suppose that "$\zeta$" is the deflection angle of the projected vector on the X-Y plane (as shown in FIG. 9B). Then a control device calculates deviation amounts $\Delta 1$, $\Delta 2$, $\Delta 3$ from the balanced state of each piezo actuator in terms of control parameters $\rho$ and $\zeta$ as $$\Delta 1 = \rho \sqrt{r^2 + h^2} \sin\zeta, \; \Delta 2 = \rho \sqrt{r^2 + h^2} \sin\left(\zeta + \frac{2}{3}\pi\right),$$

$$\Delta 3 = \rho \sqrt{r^2 + h^2} \sin\left(\zeta - \frac{2}{3}\pi\right).$$

By applying voltages V1, V2, V3 proportionate to these values to the actuators (221-A, 221-B, 221-C), the die 41 is subjected to microscopic rotation (minute wobble) in a required extent, thereby enabling the die 41 to be controlled at a desired attitude.

The present invention is not limited to only the embodiment described above and may be implemented in other alternatives. For example, these alternatives are listed below.

(A) The above embodiment has employed the ultraviolet curing resin as a forming layer. However, the forming layer may be formed of other materials such as thermoplastic resin or the like. Also, softening and/or hardening means may be selectively employed depending on a material used for the forming layer.

(B) In the present invention, the die 41 may be set onto the lower frame 7 and the forming product 13 may be mounted onto the movable body 19. In this case, the softening and/or hardening means for the forming layer may also be altered.

(C) In a case where the forming product 13 is not moved in the X- and/or Y-directions, the gimbal mechanism 45 may be located on a side on which the forming product 13 is placed. In a case where the die 41 is set onto the lower frame 7, the gimbal mechanism 45 may be mounted on the lower frame 7.

(D) The structure shown in FIGS. 2 and 3 may be arranged in an upside down configuration or in a lay-down configuration. While the above embodiment has been exemplified with reference to the vertical type structure, the present invention may employ a vertical type structure in an upside down structure or a lay-down structure.

(E) The above embodiment has employed the structure wherein the table is placed in the lower area whereas the gimbal mechanism 45 and the movable member 19 are located in the upper area. However, these configurations may be arranged in an upside down configuration. In this case, since downward force acts on a first gimbal member at all times due to its gravity, an underlying second gimbal member is applied with a suction or stick force at the magnitude less than that applied to the structure shown in FIG. 5. Further, the gravity itself can be used instead of suction or stick force. Then only levitation force for the first gimbal member may be controlled using compressed air.

(F) The above embodiment has employed the structure, a system wherein the lower gimbal member 201 (first gimbal member) is sucked toward the second gimbal member 203 (second gimbal member) in evacuation technique (that is, reduced pressure). If the forming chamber 60 placed in the downward area is evacuated in this case, suction effect cannot be expected due to such reduced pressure being cancelled. To answer this, for instance, an electromagnet or permanent magnet may be employed to allow both the gimbal members 201, 203 to be subjected to greater attraction force than suction force resulting from a depressurized effect in the forming chamber 60.

As explained above, according to the present invention has a gimbal mechanism including the first and second gimbal members through which the ultraviolet ray guide path extends, ultraviolet curing resin can be formed as a forming product by using a simplified structure. Further, regulating suction force acting on the first gimbal member makes it possible to easily adjust and hold the die mounted on the first gimbal member.

In addition, since the present invention has a movable body supported by the guide means at a substantially central position between both sides thereof, the positional displacement (lateral deviation) of the movable body can be reduced to a minimal extent if deformations of the frame occur due to temperature variations. Therefore, the positional displacement (lateral deviation) between the die and the forming product resulting from pressing force and temperature variations can be minimized.

Moreover, since the present invention has an ultraviolet ray generator, and the ultraviolet ray guide path adapted to allow the ultraviolet rays emitted from the ultraviolet ray generator to pass through the transcription die made of an ultraviolet transmitting material to be irradiated onto the forming material placed on the movable table, the ultraviolet ray can be easily introduced into the transcription area from the vertical direction area.

The entire content of Japanese Patent Application No. P2005-153003 with a filing data of May 25, 2005 of which is expressly incorporated herein by reference in its entirety.

What is claimed is:

1. A transcript apparatus comprising:
   a table having a placement surface on which a forming material is placed;
   a die holder, disposed in opposition to the table, for fixedly holding a transcription die made of an ultraviolet transmitting material, the die holder being made of an ultraviolet transmitting material;
   a gimbal mechanism, guiding ultraviolet rays therein, that includes
      a first gimbal member having one side to hold the die holder body and the other side formed with a convex spherical surface, and
      a second gimbal member formed with a concave spherical surface facing the convex spherical surface;
   a movable body, holding the second gimbal member, that is movable in a vertical direction to the placement surface;
   movable body drive means driving the movable body in the vertical direction;
   attitude adjustment and holder means for adjusting and holding an attitude of the first gimbal member;
   an ultraviolet ray generator; and
   an ultraviolet ray path for guiding ultraviolet rays emitted from the ultraviolet ray generator onto the forming material through the transcription die.

2. The transcript apparatus according to claim 1, wherein the ultraviolet ray generator is located on a side area of the movable body and supported on the movable body.

3. The transcript apparatus according to claim 1, wherein the ultraviolet ray path comprises:
   a first light guide path, formed in the movable body, for guiding the ultraviolet rays emitted from the ultraviolet ray generator in a parallel direction to the placement surface;
   a reflection mirror, disposed in one end portion of the first light guide path, for deflecting the ultraviolet rays passing through the first light guide path in a central axis of the gimbal mechanism oriented in the vertical direction; and
   a second light guide path, formed in a through-bore in the first and second gimbal members, for guiding the ultraviolet rays reflected by the reflection mirror toward the die holder.

4. The transcript apparatus according to claim 3, further comprising reflection suppressing means, formed on an inner circumferential periphery of the through-bore, for suppressing the ultraviolet rays from reflecting.

5. The transcript apparatus according to claim 4, wherein the reflection suppressing means is formed in a threaded recess.

6. The transcript apparatus according to claim 4, wherein the reflection suppressing means is formed of an ultraviolet absorbing material coated on the inner circumferential periphery of the through-bore.

7. The transcript apparatus according to claim 3, further comprising an optical fiber for guiding the ultraviolet rays emitted from the ultraviolet ray generator to the first light guide path.

8. The transcript apparatus according to claim 1, wherein the ultraviolet ray generator comprises an ultraviolet ray intensity regulator and an ultraviolet ray irradiation time regulator.

9. The transcript apparatus according to claim 1, wherein the attitude adjustment and holder means comprises
   a plurality of evacuation conduits formed inside the second gimbal member and opening to the concave spherical surface, and
   an evacuation device, connected to the evacuation conduits, for evacuating the first gimbal member toward the second gimbal member.

10. The transcript apparatus according to claim 9, wherein the evacuation device comprises evacuation force regulator means for regulating a suction force in evacuation.

11. The transcript apparatus according to claim 10, wherein the evacuation force regulator means regulates a vacuum level of the plurality of evacuation conduits.

12. The transcript apparatus according to claim 11, wherein the evacuation force regulator means regulates the vacuum level by selectively evacuating the plurality of evacuation conduits.

13. The transcript apparatus according to claim 1, wherein the attitude adjustment and holder means comprises
- air ejection conduits formed in the second gimbal member and opening to the concave spherical surface, and
- an air source, connected to the air ejection conduits, for ejecting air from the second gimbal member to the first gimbal member.

14. The transcript apparatus according to claim 1, wherein the table is translationally movable in two linearly independent directions on the placemen surface.

15. The transcript apparatus according to claim 1, wherein the first gimbal member has an expanding slant surface adjacent to the convex spherical surface, and the attitude adjustment and holder means comprises compressed gas supply conduits formed in the second gimbal member to eject compressed gas to the expanding slant surface.

16. The transcript apparatus according to claim 1, further comprising rotary means, disposed between the second gimbal member and the movable body, for rotating the second gimbal member about a central axis thereof with respect to the movable body.

17. The transcript apparatus according to claim 1, wherein a spherical center position of the convex spherical surface lies on a center axis of the first gimbal member and located on an end face of the die fixedly held on the die holder.

18. The transcript apparatus according to claim 1, further comprising detection means for detecting a signal that an end face of the transcription die comes near a vicinity of an upper surface of the forming material placed on the table, wherein the movable body moves at a slow speed in response to the signal from the detection means.

19. The transcript apparatus according to claim 1, further comprising:
- a substantially L-shaped frame;
- a lower frame integrally formed on the substantially L-shaped frame at a lower area thereof;
- a plurality of die bars having one ends fixedly secured to the lower frame and extending parallel to a vertical portion of the substantially L-shaped frame;
- an upper frame to which the other ends of the die bars are fixedly secured;
- a frame protruding section protruding from the substantially L-shaped frame to a substantially central position of the movable body on both of right and left sides thereof; and
- guide means connecting the frame protruding section and the substantially central position on the both of right and left sides of the movable body to be held in engagement with each other for sliding movements along the die bars, wherein
- the movable body is placed between the lower frame and the upper frame and is movable along the plurality of die bars, and the movable drive means comprises a servomotor mounted on the upper frame for moving the movable body along the guide means in the vertical direction.

* * * * *